Figure 1:
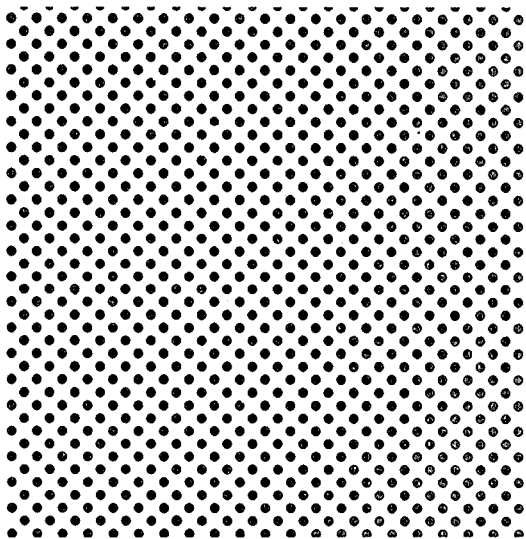

United States Patent [19]

Huck

[11] 4,286,385
[45] Sep. 1, 1981

[54] COLOR SCREEN INDICATOR

[76] Inventor: Joseph F. Huck, 904 English St., Irving, Tex. 75061

[21] Appl. No.: 107,445

[22] Filed: Dec. 26, 1979

[51] Int. Cl.³ .............................................. G02B 27/0
[52] U.S. Cl. ..................................... 33/1 N; 434/331; 350/321; 356/150; 101/211; 101/401.1
[58] Field of Search ..................... 101/401.1, 170, 211; 350/71, 150, 158, 159; 283/6; 434/331; 33/1 N

[56] References Cited

U.S. PATENT DOCUMENTS

| | | | |
|---|---|---|---|
| 2,768,577 | 10/1956 | Boyalean | 101/211 |
| 2,798,428 | 7/1957 | Tollenaar | 101/211 |
| 2,952,080 | 9/1960 | Avakian et al. | 283/6 |
| 3,109,239 | 11/1963 | Wicker et al. | 356/150 |
| 3,256,770 | 6/1966 | Wicker | 356/150 |
| 3,281,960 | 11/1966 | Gross | 434/331 |
| 3,381,612 | 5/1968 | Lecha | 101/401.1 |
| 3,393,618 | 7/1968 | Baker | 101/401.1 |
| 3,425,770 | 2/1969 | Mueller et al. | 356/71 |
| 3,457,421 | 7/1969 | Bayha | 356/71 |
| 3,784,298 | 1/1974 | Wicker | 350/321 |
| 3,876,304 | 4/1975 | Novak | 356/71 |

*Primary Examiner*—William Pieprz
*Attorney, Agent, or Firm*—Warren H. Kintzinger

[57] ABSTRACT

A composite indicator for use with overlay process color screen tints in offset color printing comprised of a composite screen made of relatively angled color screens. The respective dot patterns of the color screens have the word of the process color associated with that angle worked in by an out-of-phase dot pattern with respect to that screen background dot pattern. An overlaying color screen, when properly angled, causes, by out-of-phase moire pattern effect, the name of that color to be visually readable as a relatively lighter or darker pattern on a contrasting background.

8 Claims, 11 Drawing Figures

COLOR SCREEN INDICATOR

This invention relates in general to offset color printing techniques, and in particular to an improved angle indicator that shows at a glance whether successive ones of overprinting screen tints are relatively angularly aligned to avoid undesirable checkerboard effect (moire patterns) caused by interference between rectilinear patterns of the screens.

As an aid in understanding the application of the screen angle indicator provided in accordance with the present invention, a general description of offset color printing and the preparations involved follows:

An offset plate is a thin sheet of metal, the surface of which is specially prepared and coated with a type of photosensitive emulsion. Negatives of images to be printed are placed in tight contact with the plates, in a vacuum frame designed for this purpose, and the plates are exposed, generally, by some type of arc lamp. After processing, the plate will retain a positive image, with a surface that is receptive to ink. The offset printing technique itself is not dealt with here, however, it should be pointed out that all image areas on the plate will pick up ink equally. There is no way to control, selectively, the amount of ink deposited on various image areas.

A screen tint (or, simply, "screen") however, by breaking this area up into rows of dots small enough not to be readily perceivable, creates a lighter appearing area of the original color being printed. To the naked eye the dots appear to be a tint of the original color. The fineness or coarseness of screen tints employed usually depends on the kind of printing and on the paper used—generally ranging from 65-line (sixty-five lines per inch) screen, for newsprint, to 150-line screen for fine-coated papers. The use of screen tints also makes a common language for describing the lightness or darkness of certain colors possible. For example, a "ten percent screen" means that the screen dot size is such that, in the final product, 10% of the area covered by the screen will receive ink. (It should be noted that when referring to the percentage of screen tint negatives used to create this effect, reference is to the size of the open area of the negative.) Screen tints are available in many percentages, but are used in 10% increments generally.

By using tints of the three primary colors (red, yellow and blue) plus black in various combinations, close approximations of all visible colors can be achieved. This is called the four-color process. The colors involved, namely, magenta, cyan, yellow, and black, are known as "the process colors." This technique provides a common, pecise, way of describing colors designed in the printed piece.

Preparing a piece of art work for the printer, an artist first decides, by means of a rough sketch, which colors he will employ and where these colors will be used (This purpose should not be confused with the process used when working from full color artwork, which involves the technique of photographic color separation.). Then, assuming that the basic line artwork is completed—drawings, type, copy, etc.—an overlay for each of the color areas is cut. The overlays are cut from a piece of amber-colored, translucent film, on a clear polyester backing, which is placed over the one artwork, amber film side, up. The color area desired is outlined, cutting through the amber film, but not through the polyester backing. The unwanted amber film is then peeled away, leaving only the image areas still covered. This overlay is then assigned a notation signifying the color it represents, such as, "40% magenta, 20% cyan, 10% black."

The printer receives the artwork with its accompanying overlays, and all of these are photographed, one at a time, on a process camera, getting negatives the same size as the desired printed product. The simplest way of handling the overlays—or, the simplest to explain—is to shoot as many negatives of each as the number of colors it represents; i.e., an overlay marked, "40% magenta, 20% cyan, 10% black," needs three negatives; one for each color. Further, each overlay is photographed against a white background so that, in the negative, the background is black, and the amber image areas are open. (A film useable with this process, "Orthochromatic," is almost completely insensitive to amber.)

The negatives obtained are now separated into groups of each of the four process colors. Each group eventually will be combined in a number of exposures on a single plate used in its color, but first comes the process of stripping and laying-in the screen tint. Each negative must be positioned on a masking sheet (a sheet of paper or vinyl that is the same size as the plate to be used, specially coated to absorb the kind of light used in exposing the plate. Starting, generally, with the negative of the basic line artwork, the negatives are taped upside down to the masking sheet, in a certain, precise position, which determines where the image will fall on the plate and, eventually, on the paper. This work is done on a light table (a glass-toped table with fluorescent lights underneath the glass). The masking sheet is then turned over and is cut away from over the image areas, resulting is what is called a "flat." As hereinbefore noted, the basic artwork is generally completed first. The flat is then secured in position, upside down, on the light table by means of register pins (round pins approximately $\frac{1}{8}''$ high and $\frac{1}{4}''$ in diameter, on thin metal bases) which are taped to the light table. The masking sheets are, in some cases, pre-punched for this purpose. The flats made from the remaining negatives are made one at a time by placing masking sheets over the basic flat and aligning each negative with the base negative.

After the flats are made, it is necessary to position the correct screen tint negatives on them. It is now that an angle indicator is imortant: the screen tints which overprint one another must be positioned at certain angles relative to each other, or the rectilinear patterns of the screens interfere with each other and create an annoying checkerboard effect, or "moire" pattern. The interference pattern is minimal when the screens are positioned at angles of 30° to each other. When using the four-color process, common practice is to align the screens at the following angles: black, 45°; magenta, 75°; yellow, 90°; and cyan, 105°. Because there is only 90° in which to angle the screens, only three screens can be placed at angles of 30°. Therefore, yellow-the lightest, is placed at 45° of the black screen.

Known types of angle indicators for the above-described use include punched, pre-angled screen tints that are expensive and have little versatility, at least for use in a relatively small image, or on one flat that contains two areas requiring different-percentage screen tints. These pre-angled screens can be used as masters for aligning screen tints to be taped to the flats, but this requires four of these screens and can cause confusion and error.

Other angle indicators are of a smaller, generally hand-held variety, usually on a clear piece of film, including a protractor with parallel rows of lines at each of the screen angles. The distance between the parallel lines is determined by the line screen measurement of the screen tint used; for example, 1/65th inch for 65-line screen. The pattern formed between these lines and the screen dots disappears when the two are in perfect alignment. This device is inconvenient however as it can be used over only a small area at a time and, when hand-held, must, itself, be repositioned each time in order to be of use. In some instances, not using all of the four colors, it is possible to visually angle the screens, by taping a screen in place on one flat, at any angle, then placing the flat of an overprinting color on pins over this and shifting the second screen until a minimal pattern is obtained, then taping it down. This procedure works—but it is obvious that as the number of flats and colors increase, a standard of uniformity becomes a necessity.

It is therefore a principal object of this invention to provide an angle indicator for use in offset color printing that shows at a glance whether or not a particular screen tint is at its correct angle to be taped down.

Another object is to provide an angle indicator in the form of a unitary screen member over which color screen overlays may be placed, and which causes successive ones of four offset color titles to visually appear as the screen overlay is angularly oriented to the assigned proper angular relationship for that color.

A further object is to provide an angle indicator which may be fixed-oriented, and which will cause visual color title images to appear when a color screen overlay is properly angled for use in screening that color.

Features of this invention useful in accomplishing the above objects include a single screen member, that is a composite of four screens—one for each of the four colors used in color offset printing. Each of the individual screens from which the composite screen is formulated has a dot pattern, and the word title of the applicable color is worked into it by having the screen dots within the color title word, itself, out-of-phase with the dot pattern of the remainder of the screen. A composite screen may be photographically produced by multiple exposures of the four color screens, each angled relatively to the others, in accordance with the assigned angles for the colors. A screen tint placed over the composite indicator screen will cause, by moire effect, the color names to appear as relatively dark, or light, clearly readable contrasting areas when the relative angular relationship between screen tint overlay and composite indicator corresponds to the assigned angle for the visually readable color name.

A specific embodiment representing what is presently regarded as the best mode of carrying out the invention is illustrated in the accompanying drawings.

Figure 2:
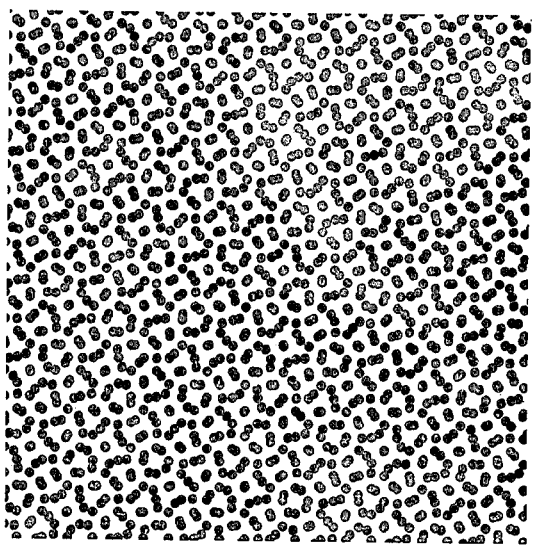
Figure 3:
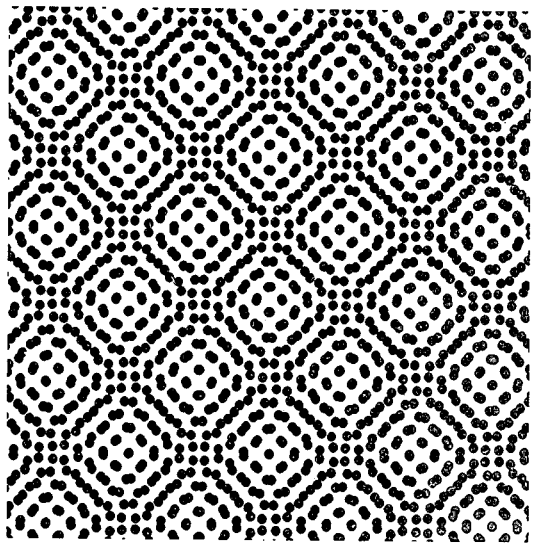
Figure 4:
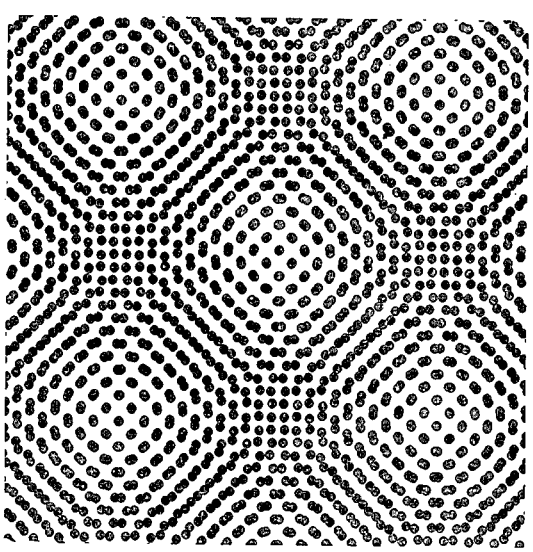
Figure 5:
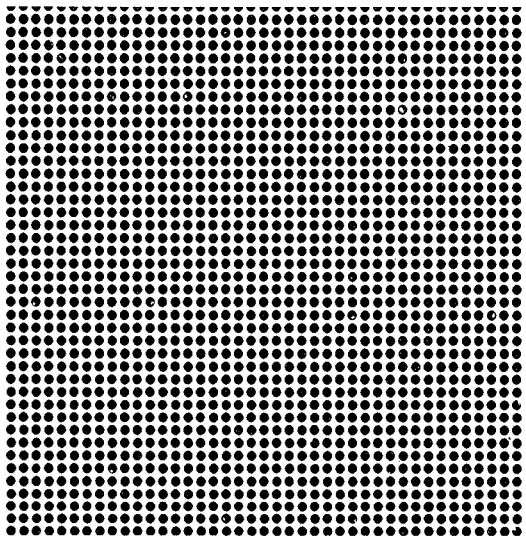
Figure 6:
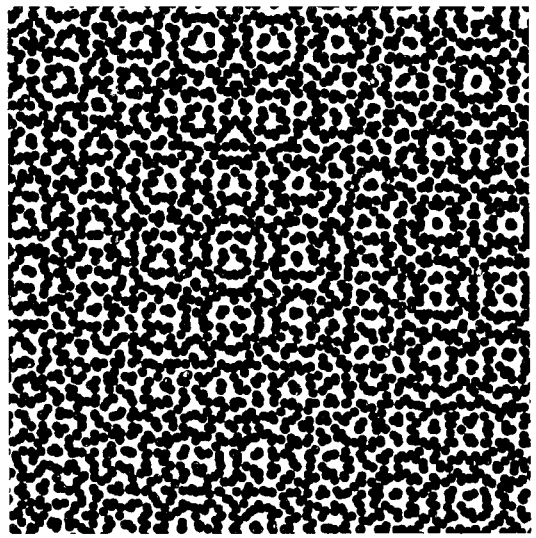
Figure 7:
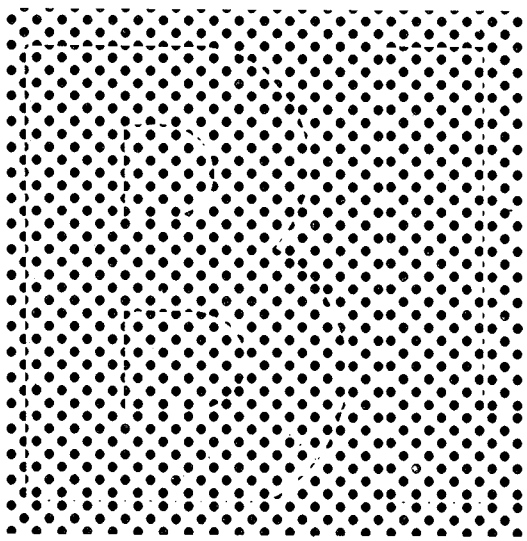
Figure 8:
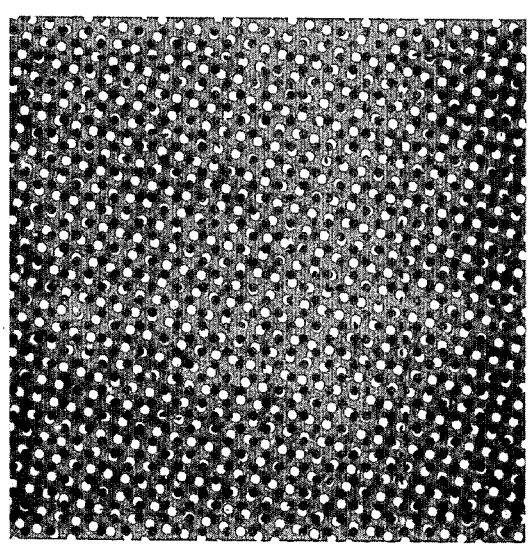
Figure 9:
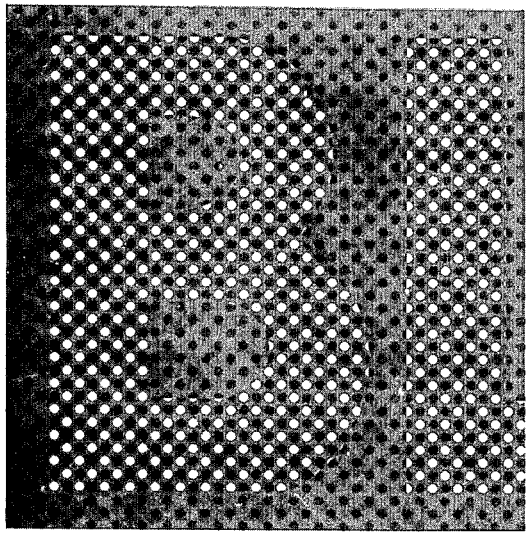
Figure 10:
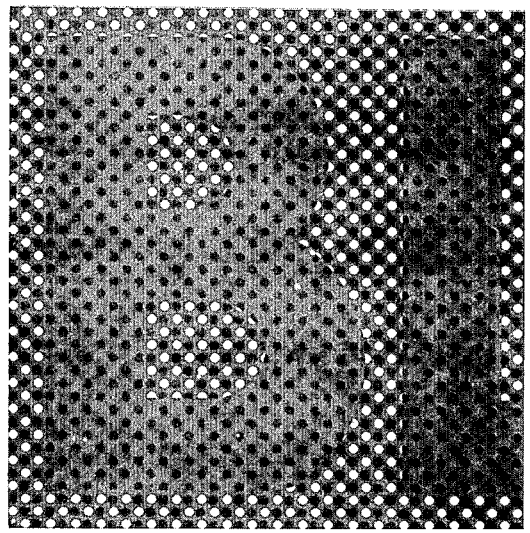
Figure 11:
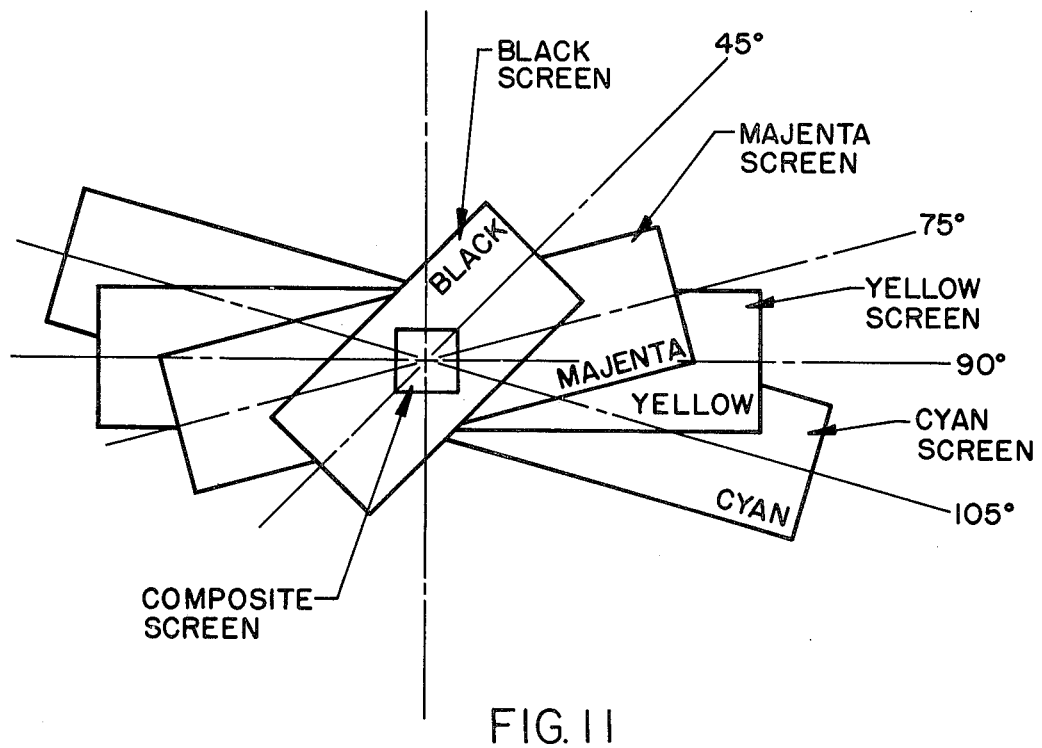

In the drawings:

FIG. 1 represents an enlargement of a typical screen tint, as employed in offset printing;

FIG. 2, the visual result of two screens of FIG. 1 overprinting at an angle of 30°;

FIG. 3, the visual result of two screens of FIG. 1 overprinting at an angle of 10°;

FIG. 4, the visual result of two screens of FIG. 1 overprinting at an angle of 5°;

FIG. 5, the visual result of two screens of FIG. 1 overprinting at an angle of 0°;

FIG. 6, a combination of four screen tints on one piece of film, made by multiple exposures at respective angles of 45°, 75°, 90°, and 105°;

FIG. 7, a portion of one of the individual screen tints from which the composite of FIG. 6 may be made, and into which the letters of the associated color word have been worked, as out-of-phase dots, into the dot pattern of the screen tint;

FIG. 8, the visual result of overprinting the color-assigned screen tint of FIG. 7, with a non-moire-angled screen overlay;

FIG. 9, the visual effect persisting as relative lightness of a certain color word, with screens in perfect angled relationship for that color;

FIG. 10, the visual effect persisting as relative darkness of certain other color words, with screens in perfect angled relationship for the color; and, FIG. 11, a diagramatic representation of the composite screen made from relatively angled individual process color screens, each having the associated color name worked into the dot pattern thereof.

Referring to the drawings:

FIG. 1 shows a typical screen tint composed of rows of opaque dots on a clear background. FIG. 2 shows two such screens overprinting at the desired angle of 30°, thereby creating a rosette pattern, which is minimal, and therefore desirable. Overprints of two such screens, as shown in FIG. 1, at angles other than the 30° optimum, cause the moire pattern that is created to become larger, and objectionable. FIG. 3 shows the larger pattern created by a 10% overprint angle, and FIG. 4, a still larger pattern created by a 5% overprint angle. The moire pattern beomes larger and larger as the screens approach alignment, with dimensions approaching mathematical infinity as the screens approach alignment. With perfect alignment, as shown by the 0° overprint angle of FIG. 5, the pattern disappears.

The angle indicator of the present invention is basically a combination of four screen tints on one piece of film, at respective angles of 45°, 75°, 90°, and 105°, for the four process colos. Reference is made to FIG. 6, which shows a combination screen of four of the typical screens of FIG. 1, at the four respective overlay angles. Any further screen tint placed over the combination screen of FIG. 6 will create a moire pattern, and rotation of the overlaying screen will cause the moire pattern to grow larger and larger until it virtually disappears. At this angled relationship, the overlaying screen is in near perfect alignment with one of the four screen patterns used in making the composite screen, and therefore at the proper angle for one of the process colors. However, because the screen angles are individually assigned to certain ones of the process colors, it is necessary to know for which color the attained proper angle has been effected.

In accordance with the present invention, the name of each color is worked into the rectilinear pattern representing its angle in the composite screen. That is, each of the four relatively angled patterns from which the composite screen pattern of FIG. 6 is made, has the name of the color associated with that pattern, worked therein such that rotation of the overlay screen to successive alignments with the four screen patterns making up the composite screen, causes the name of the color for that angle to visibly appear as a relatively light, or dark, contrast image.

The name of each of the four colors is worked into one of the four screens from which the composite indicator screen is made, by placing the screen dots exactly "out of phase" with those on the screen background, within letter outlines which spell out the color name. FIG. 7 shows an illustrative example of working the name, "BLACK" into the screen pattern representing that color. A portion of the screen is depicted in FIG. 7, it being realized that the entire word is worked in, at least once, and preferably in a repetitive fashion over the entire screen surface.

FIG. 7 shows that within the screen for the color, black, letter outlines appear. The letter, "B" and a portion of the letter, "L", are exampled. Within the letter outlines, the screen dots are out of phase with those of the rest of the screen. "Out of phase," herein, implies that the screen dot pattern within the letters is moved over and up (with respect to the background dot pattern) by one-half the distance between the dots of the screen pattern in the background. FIG. 7 thus shows that the letters are now within (worked into) the screen tint, though not obviously so. There is no change in the overall percentage grading of the screen of FIG. 7, and when the screen of FIG. 7 is overprinted by another screen, at a non-moire angle (FIG. 8), the letters of the color name become totally obliviated.

When a screen overlaying the screen of FIG. 7 produces a moire pattern, however, the moire pattern appears as a rectilinear pattern of lighter and darker areas which grow in size as the angle between the screens approaches 0°, as above stated. Simultaneously, the screen within the letters produces a similar moire pattern, and because this screen area is shifted out of phase, the moire pattern produced thereby is likewise out of the phase—that is, darker areas in the moire pattern within the letter outlines correspond to lighter areas in the moire pattern of the background screen. When the screen of FIG. 7 and the overlaying screen come into perfect alignment, the effect of the out-of-phase moire patterns persists as a relative lightness, or darkness, within the letters, as respectively indicated in FIG. 9 and FIG. 10, thereby making the effect useful for indicating a black screen overlay has come into perfect alignment.

When further screens are prepared, with names of respective associated colors worked into the dot pattern, as described above, and a composite screen is made of an overlay of the screens, at assigned color angles, rotation of a further screen overlaying the composite screen (angle indicator) will cause a sequentially visual "readout" of color names, as the relative angle for each color is attained. When a black overlay screen is being positioned angularly, when the proper angle is obtained, the name, "BLACK," is clearly readable. Similarly, further screens overlaying the composite angle indicator will create visual readouts of the associated screen color name when the proper angle is reached.

The color name readout for the composite color-indicating screen produces a somewhat decreased readout effect as compared to that attained by a single color name indicating screen—because of the increase in the number of elements; but, because these elements are more or less random, relative to the one creating the moire, their effect is minimal. No one of the screen patterns making up the composite imparts any adverse effect to the moire patterns created by, and the words represented in, other screens contributing to the composite indicating screen.

The composite screen color angle indicator herein described can be fabricated using available photographic techniques. One method useful in making the indicator comprises setting the color title words in big, bold type, to produce an artwork layout for each color; the color name being repeated to cover the entire area of the indicator. Then, negatives are made of each of the color-name-bearing artwork sheets. Next, contact film positives are made of each of the four negatives, and each of the negatives, with its accompanying positive, is put on register pins and brought into exact alignment. Two complete sets of four pre-angled screen tints (80% screens preferable) of the proper size are then put on register pins and affixed so that the screens of the second set are aligned and exactly out of phase (as earlier explained) with the first set. As will be further described, these two sets of screen tints are used in conjunction with the negatives and positives of the color-name artwork previously made—one set of screen tints with the artwork negatives, and one set of screen tints with the artwork positives.

Finally, a piece of contact duplication film is placed and fixed in position in a contact frame. One of the color-name artwork negatives, with its screen beneath it, is placed over the contact duplication film, and held in position by means of register pins, after which a contact exposure is made. The corresponding film positive, with its screen tint beneath it, is placed on the same register pins and over the same piece of film; and, with contact made, the film is exposed again. Processing the contact film produces the color-name-bearing screen, as exampled in FIG. 7 for the color, black.

The above process is repeated, using the color-name artwork for the other three colors. When all four duplicate screens are made, they are placed in contact frame, one on top of the other, over a piece of duplication film, then brought into contact with the film that, when exposed and developed, yields the final product—one piece of film that contains screens pre-angled for all four process colors, with each screen containing the name of an associated color within its dot pattern. The composite screen is depicted diagramatically in FIG. 11.

The present invention is thus seen to provide a useful angle indicator in the form of a single composite screen over which successive overprinting color screens can be placed and angularly oriented, with the color name associated with each color overlay being readable when the proper angled relationship for that color overlay is realized.

Whereas this invention is herein illustrated and described with respect to a particular embodiment hereof, it should be realized that various changes may be made without departing from essential contributions to the art made by the teachings hereof.

I claim:

1. An angle indicator for use with overlaying ones of offset color printing screens comprising a unitary composite screen film having a plurality of superimposed rectilinear dot patterns, each arranged as a rectangular array of rows and columns of dots and each defined by a respective one of multiple exposed dot pattern images on said unitary screen film, with each said dot pattern associated with an individual different one of plural process colors, said dot pattern exposed images being respectively relatively angularly oriented, one to the other, each of said dot patterns being formed with predetermined portions thereof within which the dot rows are shifted midway between dot rows of the remainder of that pattern and the dot columns are shifted midway between dot columns of the remainder of that pattern, and with said predetermined portions of each of said dot patterns being respectively distinctively different.

2. The indicator of claim 1, wherein said predetermined dot pattern portions of said plurality of dot patterns are descriptive of respective different ones of said plural process colors.

3. The indicator of claim 2, with the predetermined dot pattern portions of each said dot pattern collectively spelling the name of that one of said process colors associated with that dot pattern.

4. The indicator of claim 3, with said predetermined dot pattern portions repetitively spelling the name of the associated process color.

5. The indicator of claim 3, with said plural dot patterns respectively angularly oriented at angles 45°, 75°, 90° and 105°, with the predetermined portions of said plural dot patterns respectively defining descriptors of process colors, black, magenta, yellow and cyan.

6. The indicator of claim 5, with said descriptors comprising the respective names of said process colors.

7. The indicator of claim 6, with said descriptors being repeated over the expanse of the associated dot pattern.

8. The indicator of claim 1, with each of said plural dot patterns and predetermined portions thereof defining an 80° screen tint.

* * * * *